(12) United States Patent
Chauhan et al.

(10) Patent No.: US 11,852,663 B2
(45) Date of Patent: Dec. 26, 2023

(54) VOLTAGE MONITOR USING A CAPACITIVE DIGITAL-TO-ANALOG CONVERTER

(71) Applicant: TEXAS INSTRUMENTS INCORPORATED, Dallas, TX (US)

(72) Inventors: Rajat Chauhan, Bangalore (IN); Danielle Griffith, Richardson, TX (US); Per Torstein Roine, Oslo (NO); James Murdock, Richardson, TX (US); Bernhard Ruck, Freising (DE)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 17/824,505

(22) Filed: May 25, 2022

(65) Prior Publication Data

US 2022/0283207 A1  Sep. 8, 2022

Related U.S. Application Data

(63) Continuation of application No. 15/717,219, filed on Sep. 27, 2017, now Pat. No. 11,372,032.

(51) Int. Cl.
  *G01R 19/257*  (2006.01)
  *H03M 1/66*  (2006.01)
  *G01R 31/3835*  (2019.01)

(52) U.S. Cl.
  CPC ....... *G01R 19/257* (2013.01); *G01R 31/3835* (2019.01); *H03M 1/66* (2013.01)

(58) Field of Classification Search
  CPC .. H02M 3/156; H02M 1/0845; H02M 1/0012; H02M 3/157; H02M 1/007; H02M 1/008; H02M 3/1588; H02M 1/0074; H02M 3/00; H02M 3/1582; H02M 3/1584; H02M 3/33592; H02M 1/084; G01R 21/00; G01R 19/257; G01R 31/3835; H03M 1/468; H03M 1/66; G06F 1/3203
  See application file for complete search history.

(56) References Cited

U.S. PATENT DOCUMENTS

| | | |
|---|---|---|
| 5,675,340 A | 10/1997 | Hester |
| 7,015,841 B2 | 3/2006 | Yoshida |
| 7,233,273 B2 | 6/2007 | Tachibana |
| 7,265,708 B2 | 9/2007 | Mitra |

(Continued)

*Primary Examiner* — Vinh P Nguyen
(74) *Attorney, Agent, or Firm* — Mandy Barsilai Fernandez; Frank D. Cimino

(57) ABSTRACT

One example relates to a monitoring circuit that includes a capacitive digital-to-analog converter that receives a binary code, a reference voltage, a monitored voltage, and a ground reference, the capacitive digital-to-analog converter outputting an analog signal based on the binary code, the reference voltage, the monitored voltage, and the ground reference. The monitoring circuit further includes a comparator including a first input coupled to receive the analog signal and a second input coupled to the reference voltage, the comparator comparing the analog signal to the reference voltage and outputting a comparator signal based on the comparison. The monitoring circuit yet further includes a binary code generator that generates the binary code based on the comparator signal, the binary code approximating a magnitude of the monitored voltage.

21 Claims, 3 Drawing Sheets

(56) References Cited

U.S. PATENT DOCUMENTS

| | | |
|---|---|---|
| 7,880,659 B2 | 2/2011 | Lee |
| 8,766,839 B2 * | 7/2014 | Janakiraman ....... H03M 1/0697 |
| | | 341/161 |
| 8,841,529 B2 | 9/2014 | Rovner |
| 9,287,891 B1 | 3/2016 | Lee |
| 9,774,345 B1 * | 9/2017 | Yoshioka ............ H03M 1/0854 |
| 10,079,609 B2 * | 9/2018 | Fan ....................... H03M 1/468 |
| 10,756,748 B1 | 8/2020 | Khatavkar |
| 10,903,843 B1 * | 1/2021 | Monangi ............... H03M 1/462 |
| 11,372,032 B2 * | 6/2022 | Chauhan ................ H03M 1/66 |
| 2003/0234736 A1 | 12/2003 | Tachibana |
| 2010/0001892 A1 | 1/2010 | Aruga |
| 2013/0278453 A1 | 10/2013 | Steensgaard-Madsen |
| 2014/0070968 A1 | 3/2014 | Janakiraman |
| 2018/0205388 A1 | 7/2018 | Aruga |

* cited by examiner

VOLTAGE MONITOR USING A CAPACITIVE DIGITAL-TO-ANALOG CONVERTER

CROSS-REFERENCE TO RELATED APPLICATION

This application is a continuation of U.S. patent application Ser. No. 15/717,219, filed on Sep. 27, 2017, now U.S. Pat. No. 11,372,032, which is fully incorporated herein by reference.

TECHNICAL FIELD

This disclosure relates generally to monitoring, and more specifically to voltage monitoring.

BACKGROUND

Laptop computers, tablet computers, cellular telephones, and other devices are increasingly utilizing battery power for portability. Such devices monitor a charge state of their batteries as a basis to conserve power and provide an indication as to when to charge the batteries. To perform such monitoring, these devices employ a battery monitor. To minimize impact on the battery that it is monitoring, this battery monitor minimizes an amount of power that it is drawing from the battery. Additionally, such devices are being further reduced in size to increase portability. This push to produce smaller and smaller devices limits an amount of space within these devices for the battery monitor. Some such devices employ resistor dividers to monitor their batteries, but such resistor dividers take up a relatively large area to minimize current drawn by the battery monitor.

SUMMARY

One example relates to a monitoring circuit that includes a capacitive digital-to-analog converter that receives a binary code, a reference voltage, a monitored voltage, and a ground reference, the capacitive digital-to-analog converter outputting an analog signal based on the binary code, the reference voltage, the monitored voltage, and the ground reference. The monitoring circuit further includes a comparator including a first input coupled to receive the analog signal and a second input coupled to the reference voltage, the comparator comparing the analog signal to the reference voltage and outputting a comparator signal based on the comparison. The monitoring circuit yet further includes a binary code generator that generates the binary code based on the comparator signal, the binary code approximating a magnitude of the monitored voltage.

Another example relates to a method that includes selectively receiving a monitored voltage at an input of a capacitive digital-to-analog converter. The method further includes producing an analog signal with the capacitive digital-to-analog converter based on a binary code and the monitored voltage. The method further includes comparing the analog signal to a reference voltage in accordance with a clock signal. The method further includes producing the binary code based on the comparison of the analog signal to the reference voltage, the binary code approximating a magnitude of the monitored voltage.

Another example relates to another monitoring device that includes a plurality of capacitors connected in parallel with each other, each of the plurality of capacitors being selectively coupled to or decoupled from a ground reference in accordance with a binary code to provide an analog signal. The monitoring device further includes a plurality of switch devices to selectively couple and decouple the each of the plurality of capacitors to/from the ground reference in accordance with the binary code. The monitoring device further includes a comparator including a first input coupled to receive the analog signal and a second input coupled to a reference voltage, the comparator comparing the analog signal to the reference voltage and outputting a comparator signal based on the comparison. The monitoring device further includes a binary code generator that generates the binary code based on the comparator signal, the binary code approximating a magnitude of the monitored voltage.

DETAILED DESCRIPTION

The disclosure relates to a monitoring circuits, devices, and methods for monitoring a voltage. As an example, the monitoring circuit includes a capacitive digital-to-analog converter that receives a binary code, a reference voltage, a monitored voltage, and a ground reference. The capacitive digital-to-analog converter outputs an analog signal based on the binary code, the reference voltage, the monitored voltage, and the ground reference. The monitoring circuit further includes a comparator including a first input coupled to receive the analog signal and a second input coupled to the reference voltage. The comparator compares the analog signal to the reference voltage and outputting a comparator signal based on the comparison. The monitoring circuit also includes a binary code generator that generates the binary code based on the comparator signal, such that the binary code approximates a magnitude of the monitored voltage.

Such a monitoring circuit may be implemented to continuously monitor a battery voltage, which allows for better power management for devices utilizing the monitoring circuit to monitor battery power. Such power management may include selective powering of other devices and/or timing when such other devices are powered.

Figure 1:
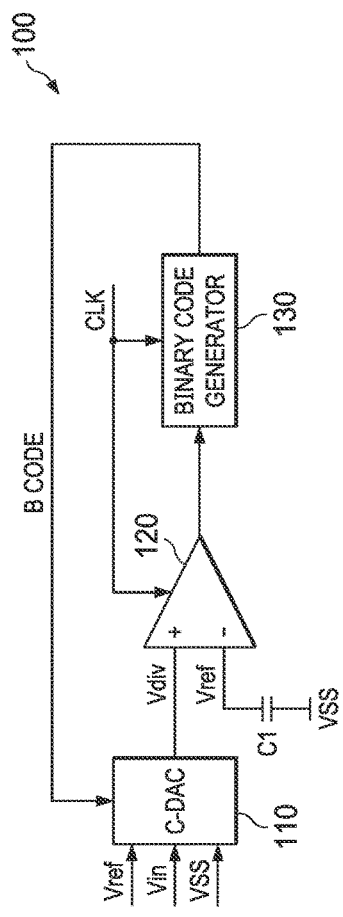
FIG. 1 illustrates an example monitoring device that monitors a voltage.

FIG. 1 illustrates an example monitoring circuit 100 that monitors a voltage. The monitoring circuit 100 includes a capacitive digital-to-analog converter (C-DAC) 110. The C-DAC 110 receives a binary code or a "B code", a reference voltage Vref, a monitored voltage Vin, and a ground reference VSS. The C-DAC 110 outputs an analog signal based on the B code. In an example, the C-DAC 110 is a capacitive voltage-divider DAC. The C-DAC 110 includes an input that receives the reference voltage Vref to pre-charge capacitors of the C-DAC 110. The C-DAC 110 includes another input that receives the monitored voltage Vin. In an example, the monitored voltage Vin is a battery voltage that is being monitored. In an example, Vin is greater than Vref. In another example, monitored voltage Vin is less than reference voltage Vref. In yet another example, monitored voltage Vin is approximately equal to reference voltage Vref. The C-DAC 110 further includes another input that is coupled to the ground reference VSS. In an example, the ground reference VSS is a system ground. The C-DAC 110 further includes yet another input on which it received the B code. The C-DAC 110 includes an output, with the C-DAC 110 outputting an analog signal Vdiv on the output in accordance with the B code. This B code controls whether individual capacitors of the C-DAC 110 are selectively coupled and decoupled to/from either the reference voltage Vref, the monitored voltage Vin, or the ground reference VSS. The C-DAC 110 includes a sampling phase and a conversion phase, with the sampling and the conversion phases performed in accordance with the B code.

The monitoring circuit 100 further includes a comparator 120. The comparator 120 includes a first input coupled to receive the analog signal Vdiv from the C-DAC 110 and a second input coupled to the reference voltage Vref. The comparator 120 compares the analog signal Vdiv to the reference voltage Vref and outputs a comparator signal based on the comparison. In an example, the comparator 120 is an edge-based clock-based comparator. A positive input of the comparator 120 is coupled to the output of the C-DAC 110 and a negative input of the comparator 120 is coupled to one side of a capacitor C1, which is pre-charged to the reference voltage Vref. The other side of the capacitor C1 is coupled to the reference voltage Vref to pre-charge the capacitor C1 to the ground reference VSS. The comparator 120 includes an output to output a comparator signal, e.g., either a logic high signal or a logic low signal, in accordance with a comparison of the voltages received on the two inputs of the comparator 120. The comparator 120 further includes an input that receives a clock signal CLK, with the clock signal CLK controlling the timing of the comparison between the voltages received on the two inputs of the comparator 120 and the timing of the output of the comparator 120.

The monitoring circuit 100 further includes a binary code generator 130 that generates the B code based on the comparator signal. For example, the B code has a value that approximates a magnitude of the monitored voltage Vin. The binary code generator 130 includes an output on which the binary code generator 130 outputs the B code to the C-DAC 110. In an example, the binary code generator 130 is an up-down counter that increments or decrements the binary code based on the comparator signal. In another example, the binary code generator 130 is a Successive Approximation Register (SAR) that adjusts the binary code based on the comparator signal. The binary code generator 130 includes an input to input the logic signal output by the comparator 120. The binary code generator 130 produces the B code in accordance with the comparator signal received from the comparator 120. In an example, the binary code generator 130 stores a count value and begins counting from a reset value, e.g., zero, incrementing the count value in response to receiving a logic high signal from the comparator 120 and decrementing the count value in response to receiving a logic low signal from the comparator 120. Over a course of a number of clock cycles of the clock signal CLK, the count value will increment and decrement in accordance with the logic signal received from the comparator 120 to converge on a multi-bit binary value approximating the magnitude of the monitored voltage Vin that is received by the C-DAC 110.

The monitoring circuit 100 is an ultra-low power consumption device that draws approximately zero static direct current (DC) from a power supply while not actively monitoring the monitored voltage Vin, e.g., while not performing a conversion to approximate a magnitude of the monitored voltage Vin input to the C-DAC 110. In an example, the monitoring circuit 100 only utilizes switching power, which can be controlled via a frequency of the clock signal CLK. The monitoring circuit 100 may be utilized in applications in which high precision and speed are not prioritized. In an example, the reference voltage Vref is produced by a high output-impedance voltage source. In an alternate example, a low impedance Vref source produces the reference voltage Vref intermittently. For example, such a low impedance Vref source can occasionally provide the reference voltage Vref during every conversion phase of the sampling circuit 100 and not during the sampling phase, thus being utilized a majority of the time to ensure that the monitoring circuit 100 consumes ultra-low power. In an example, the monitoring circuit 100 continuously monitors the monitored voltage Vin without switching between reference voltage sources. In another example, the monitoring circuit 100 executes a duty cycle to periodically monitor the monitored voltage Vin.

In an example, the monitoring circuit 100 works with a high output-impedance Vref source to minimize power draw. Moreover, unlike some existing monitoring circuits that utilize a resistor divider, the monitoring circuit 100 can create divide ratios of less than 1 with a "capacitive divider", i.e. having a higher output voltage than is input. To create such a divide ratio, an input voltage Vin is initially put over the capacitors of the C-DAC 110 instead of 0V, and then some of the capacitors of the C-DAC 110 are switched from 0V to the input voltage Vin. This scheme can cover the "division range" of 1 to ½, i.e. up to twice as high output voltage compared to the input voltage. In an example, this enables tracking voltages down to Vref/2, which is useful because the reference voltage Vref should be as high as possible for noise reasons. In an example, the reference voltage Vref is approximately equal to a 1.22V bandgap voltage.

Compared to some existing monitoring devices that utilize a SAR, the monitoring circuit 100 performs sampling periodically in accordance with leakage of capacitors of the C-DAC 110. As the reference voltage Vref is only utilized during sampling, an advantage is realized even if the reference voltage Vref is produced by low impedance reference source. A low impedance reference source typically results in high power consumption. But, because the sampling only occurs periodically, sampling can be turned off a majority of time, which helps reduce average power consumption.

In an example, the monitoring circuit 100 continuously monitors a battery voltage while consuming extremely low power, e.g., approximately less than 1 uA. This power consumption is in contrast to other monitoring circuits that monitor a battery voltage utilizing resistor dividers which utilize a large area to achieve low power consumption, e.g., approximately 4-6 uA or more. Thus, this monitoring circuit consumes approximately less power than other monitoring circuits that rely on resistor dividers, while also utilizing a much smaller area to implement the monitoring circuit. Moreover, because this monitoring circuit only consumes power during a conversion phase, this device may consume about 10× less power than resistor divider based monitoring circuits.

Figure 2:
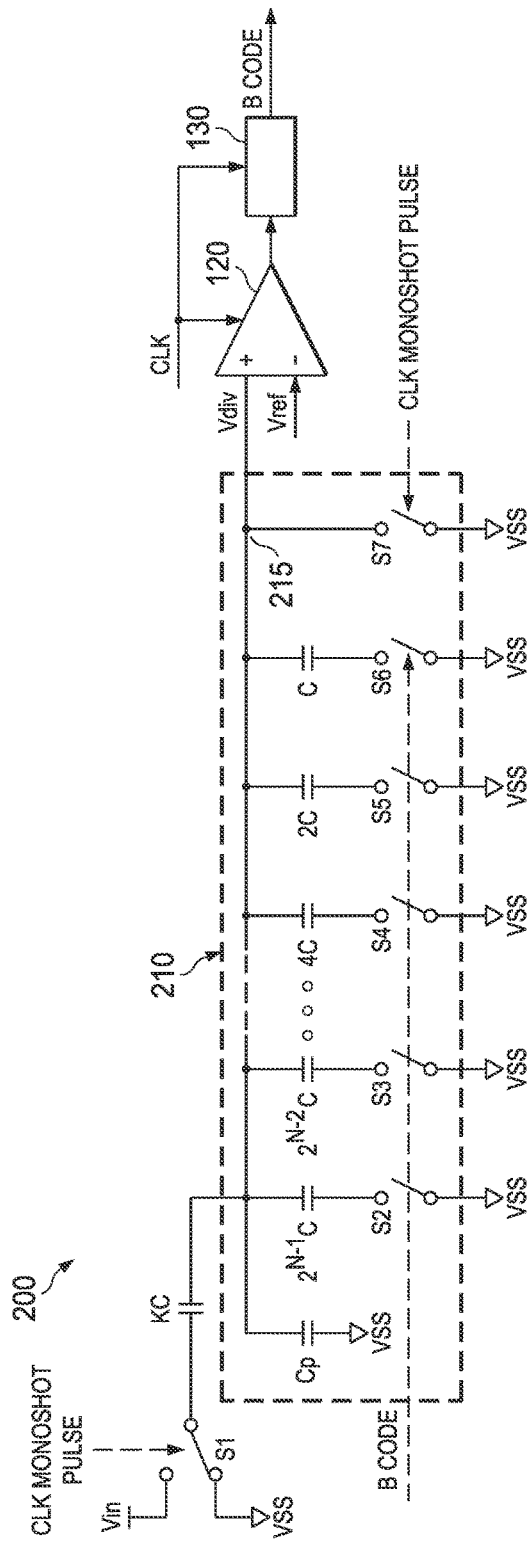
FIG. 2 illustrates another example monitoring device that monitors a voltage.

FIG. 2 illustrates another example monitoring circuit 200 that monitors a voltage. The monitoring circuit 200 includes the structure of the monitoring circuit 100 as well as its benefits and functionality. The monitoring circuit 200 includes a switch device S1 (e.g., a transistor switch) that selectively couples the monitoring circuit 200 to either the monitored voltage Vin being monitored or the ground reference VSS. The switch device S1 selectively couples the monitoring circuit 200 to either the monitored voltage Vin or the ground reference VSS in accordance with a "CLK monoshot pulse" that is derived from the clock signal CLK, but triggers such coupling periodically and less frequently than the cycling of the clock signal CLK, e.g., 1 CLK monoshot pulse for every 100 conversions by a C-DAC 210. In an example, a counter (not shown) can be used to count a number of cycles of the clock signal CLK, and trigger the CLK monoshot pulse every X number of cycles of the clock signal CLK, where X is a function of the leakage of the capacitor KC. The switch device S1 switches in accordance with the CLK monoshot pulse to couple the monitored voltage Vin to a plate of the capacitor KC coupled to the switch device S1 to charge the capacitor KC to a voltage level of the monitored voltage Vin, during a conversion phase of the C-DAC 210. The switch device S1 switches in accordance with the CLK monoshot pulse to couple the ground reference VSS to the plate of the capacitor KC coupled to the switch device S1 to discharge the capacitor KC, during a sampling phase of the C-DAC 210.

The monitoring circuit 200 further includes the C-DAC 210 that includes a plurality of capacitors coupled in parallel. As shown in the example of FIG. 2, the bottom plates of the plurality of capacitors are selectively coupled to ground (e.g., by switch devices S2-S6, respectively) and the top plates of the plurality of capacitors are coupled to a coupling that extends between the node 215 (e.g., input of a comparator 120) and a plate of the capacitor KC. In this example, the C-DAC includes the capacitors $2^{N-1}C$, $2^{N-2}C$, . . . , 4C, 2C, C, an output node 215, and switch devices S2-S6 that are respectively coupled to a plate of these capacitors opposite a side that is coupled to the node 215. Capacitor Cp is illustrated as being directly coupled to both node 215 and ground reference VSS, with capacitor Cp representing the parasitic capacitance within the C-DAC 110. Capacitor Cp reduces an accuracy of the voltage Vdiv produced by the C-DAC 110. One side of each of the capacitors $2^{N-1}C$, $2^{N-2}C$, . . . , 4C, 2C, C is coupled to the node 215 and an opposite side of each of the capacitors $2^{N-1}C$, $2^{N-2}C$, . . . , 4C, 2C, C are selectively coupled to the ground reference VSS in accordance with the B code, via the respective switch devices S2-S6.

The node 215 is coupled to a switch device S7 and to each the capacitors $2^{N-1}C$, $2^{N-2}C$, . . . , 4C, 2C, C that is coupled to the capacitor KC. The switch device S7 also switches in accordance with the CLK monoshot pulse. The switch device S7 switches in accordance with the CLK monoshot pulse to couple a plate of the capacitor KC coupled to the switch device S7 to ground reference VSS, during the sampling phase of the C-DAC 210. The switch device S7 switches in accordance with (e.g., in response to) the CLK monoshot pulse to de-couple the plate of the capacitor KC coupled to the switch device S7, during a conversion phase of the C-DAC 210.

During a sampling phase of the monitoring circuit 200, switch device S1 couples the plate of capacitor KC coupled to switch device S1 to the ground reference VSS, switch device S7 couples node 215 to the ground reference VSS, and switch devices S2-S6 couple and the plate of selected capacitors $2^{N-1}C$, $2^{N-2}C$, . . . , 4C, 2C, C (Bcode*C) coupled to switch devices S2-S6, respectively, to the ground reference VSS, with remaining capacitors $2^{N-1}C$, $2^{N-2}C$, . . . , 4C, 2C, C being floated (e.g., uncoupled from the ground reference VSS). Thereafter, during the next phase of the monitoring circuit 200, the conversion phase, the switch S1 couples the plate of capacitor KC coupled to switch device S1 to the monitored voltage Vin, switch S7 uncouples node 215 from the ground reference VSS to float node 215, and switch devices S2-S6 maintain a coupling between the plate of capacitors $2^{N-1}C$, $2^{N-2}C$, . . . , 4C, 2C, C (B.sub.code*C) coupled to switch devices S2-S6 and the ground reference VSS. In an alternate example, during a sampling phase of the monitoring circuit 200, switch device S1 couples the plate of capacitor KC coupled to switch device S1 and node 215 to the monitored voltage Vin, and switch devices S2-S6 couple selected plates of capacitors $2^{N-1}C$, $2^{N-2}C$, . . . , 4C, 2C, C (Bcode*C) coupled to switch devices S2-S6 to the monitored voltage Vin, with remaining capacitors $2^{N-1}C$, $2^{N-2}C$, . . . , 4C, 2C, C being floated (e.g., uncoupled from monitored voltage Vin). During a conversion phase of the monitoring circuit 200, the switch device S1 maintains a coupling of the plate of capacitor KC coupled to switch device S1 to Vin, switch S7 disconnects node 215 to float node 215, and switch devices S2-S6 couple the plate of capacitors $2^{N-1}C$, $2^{N-2}C$, . . . , 4C, 2C, C (B.sub.code*C) coupled to the switch devices S2-S6 to ground reference VSS.

The binary code generator 130 will converge at a digital code where the voltage Vdiv corresponds to the reference voltage Vref. This convergence may occur at a positive edge of the clock signal CLK. As an example, the voltage Vdiv is equal to:

$$Vin \times \frac{KC}{(B_{code}+K)C} = Vref;$$

$$Vin = Vref(1 + \frac{Bcode}{K}); \text{ and}$$

$$Vin = Vref * \left(1 + \frac{Bcode}{K} + \frac{Kp}{K}\right)$$

where C is a unit capacitance, K is a ratio between capacitor KC and unit capacitance, and Kp is a ratio between parasitic capacitance Cp to the unit capacitance.

Figure 3:
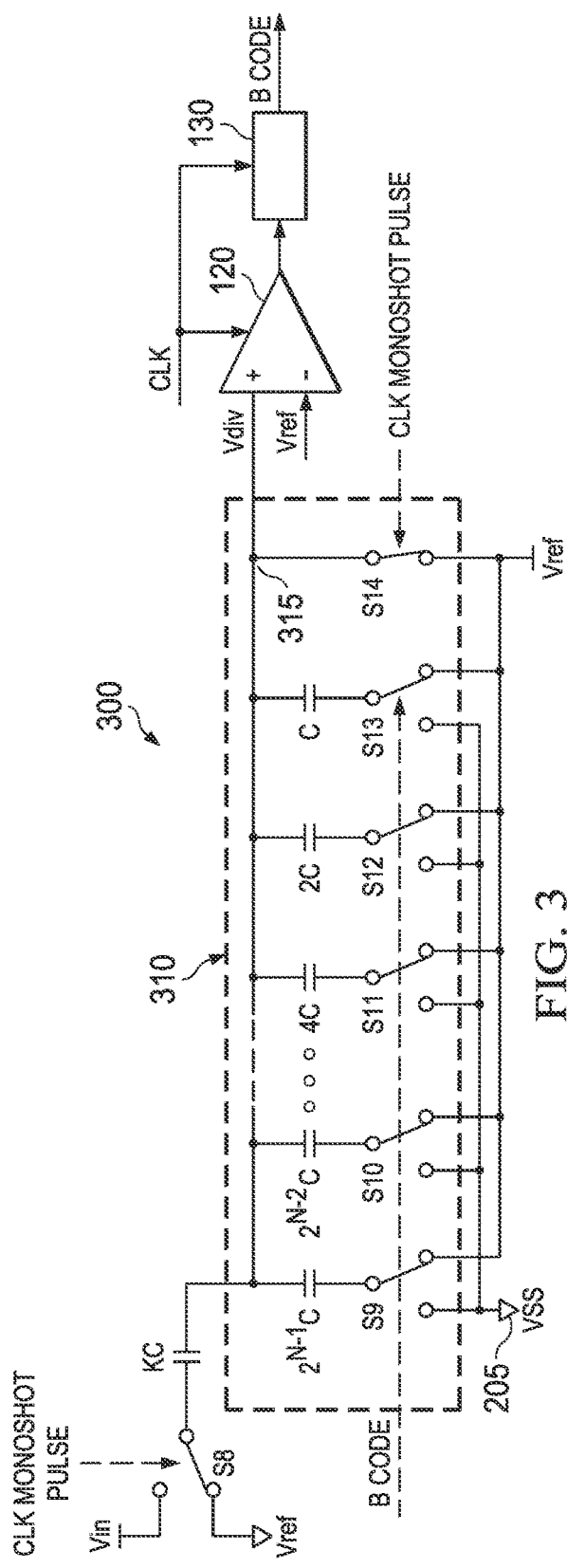
FIG. 3 illustrates yet another example monitoring device that monitors a voltage.

FIG. 3 illustrates yet another example monitoring circuit 300 that monitors a voltage. The monitoring circuit 300 includes the structure of the monitoring circuit 100 as well as its benefits and functionality. The monitoring circuit 300 includes a switch device S8 (e.g., a transistor switch) that selectively couples the monitoring circuit 300 to either the monitored voltage Vin or the reference voltage Vref. The switch device S8 selectively couples the monitoring circuit 300 to either the monitored voltage Vin being monitored or the reference voltage Vref in accordance with the CLK monoshot pulse. The switch device S8 switches in accordance with the CLK monoshot pulse to couple the monitored voltage Vin to a plate of the capacitor KC coupled to the switch device S8 to charge the capacitor KC to a voltage level of the monitored voltage Vin, during a conversion phase of the C-DAC 210. The switch device S8 switches in accordance with the CLK monoshot pulse to couple the reference voltage Vref to the plate of the capacitor KC coupled to the switch device S1 to precharge node 215 to a voltage level of the reference voltage Vref, during a sampling phase of the C-DAC 210.

The monitoring circuit 300 further includes a C-DAC 310 that includes the plurality of capacitors $2^{N-1}C$, $2^{N-2}C$, . . . , 4C, 2C, C, an output node 315, and switch devices S9-S13 that are respectively coupled to a plate of these capacitors opposite a side that is coupled to the node 315. One side of each of the capacitors $2^{N-1}C, 2^{N-1}C, \ldots, 4C, 2C, C$ are coupled to the node 315 and an opposite side of each of the capacitors $2^{N-1}C, 2^{N-2}C, \ldots, 4C, 2C, C$ are selectively coupled to either the ground reference VSS or the reference voltage Vref in accordance with the B code, via the switch devices S9-S13.

The node 315 is coupled to a switch device S14 and to plates of each the capacitors $2^{N-1}C, 2^{N-2}C, \ldots, 4C, 2C, C$ coupled to the capacitor KC. The switch device S14 also switches in accordance with the CLK monoshot pulse. The switch device S14 switches in accordance with the CLK monoshot pulse to couple a plate of the capacitor KC coupled to the switch device S14 to reference voltage Vref, during the sampling phase of the C-DAC 310. The switch device S14 switches in accordance with the CLK monoshot pulse to de-couple the plate of the capacitor KC coupled to the switch device S14, during a conversion phase of the C-DAC 310.

During a sampling phase of the monitoring circuit 300, the switch device S8 couples the plate of capacitor KC coupled to switch device S8 to the reference voltage Vref, switch device S14 couples node 315 to the reference voltage Vref, and switch devices S9-S13 couple the plate of selected capacitors $2^{N-1}C, 2^{N-2}C, \ldots, 4C, 2C, C$ (Bcode*C) coupled to switch devices S9-S13 to the reference voltage Vref, with the plate of remaining capacitors $2^{N-1}C, 2^{N-2}C, \ldots, 4C, 2C,$ and C being floated (e.g., electrically disconnected from both VSS and Vref) during the sampling phase. Thereafter, during a conversion phase of the monitoring circuit 300, switch device S8 couples the plate of capacitor KC coupled to switch device S8 to the monitored voltage Vin, switch device S14 disconnects the node 315 from Vref to float node 315, and switch devices S9-S13 couple the plates of one or more selected capacitors $2^{N-1}C, 2^{N-2}C, \ldots, 4C, 2C,$ and C (Bcode*C) coupled to switch devices S9-S13 to ground reference VSS.

A transfer function of monitoring circuit 300 results in the monitored voltage Vin as being a more accurate linear function of Bcode, reducing an accuracy due to parasitic capacitance CP of the B code in accordance with the equation:

$$Vin = Vref * \left(1 + \frac{Bcode}{K}\right)$$

Figure 4:
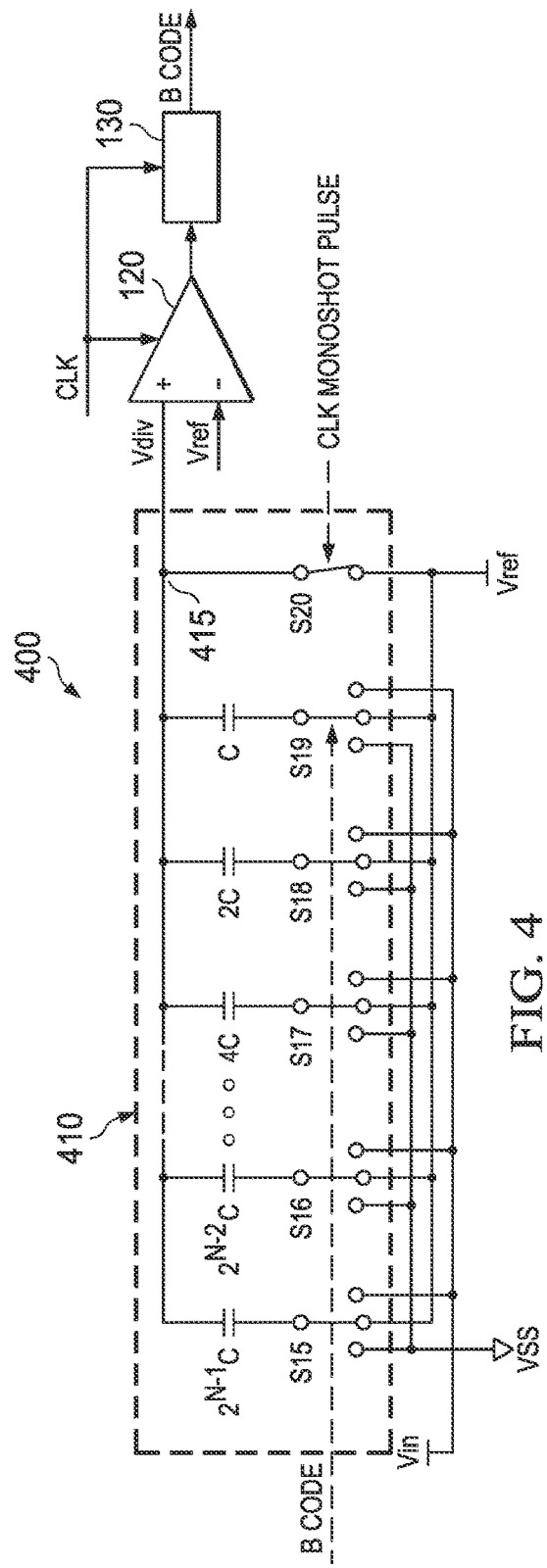
FIG. 4 illustrates yet another example monitoring circuit that monitors a voltage.

FIG. 4 illustrates yet another example monitoring circuit 400 that monitors a voltage. The monitoring circuit 400 includes the structure of the monitoring circuit 100 as well as its benefits and functionality. In this example, the monitoring circuit 400 includes a C-DAC 410 that includes the capacitors $2^{N-1}C, 2^{N-2}C, \ldots, 4C, 2C, C$, an output node 415, and switch devices S15-S19 that are respectively coupled to a plate of these capacitors opposite a side at which the node 415 is coupled to these capacitors. Plates of each of the capacitors $2^{N-1}C, 2^{N-2}C, \ldots, 4C, 2C, C$, opposite the switch device S15-S19 are coupled to the node 415. A plate of each of the capacitors $2^{N-1}C, 2^{N-2}C, \ldots, 4C, 2C, C$, coupled to switch devices S15-S19 are selectively coupled to either the monitored voltage Vin, the ground reference VSS, or the reference voltage Vref, in accordance with the B code. The node 415 is selectively coupled to the reference voltage Vref in accordance with the CLK monoshot pulse applied to switch S20.

During a sampling phase of the monitoring circuit 400, switch devices S15-S20 respectively couple node 415 and the plate of all of the capacitors $2^{N-1}C, 2^{N-2}C, \ldots, 4C, 2C, C$ coupled to switch devices S15-S19 to the reference voltage Vref. Thereafter, during a conversion phase of the monitoring circuit 400, switch device S20 disconnect the node 415 from the reference voltage Vref to float node 415, and switch devices S15-S19 couple the plate of selected capacitors $2^{N-1}C, 2^{N-2}C, \ldots, 4C, 2C, C$ (Bade*C) coupled to switch devices S15-S19 to the monitored voltage Vin, with the switch devices S15-S19 coupling the remaining capacitors $2^{N-1}C, 2^{N-2}C, \ldots, 4C, 2C, C$ to the ground reference VSS.

A transfer function of monitoring circuit 400 results in the monitored voltage Vin as being a non-linear function of the B code in accordance with the equation:

$$Vin = \frac{Vref*(2^N - 1)}{Bcode}$$

Alternatively, during a sampling phase of the monitoring circuit 400 selected capacitors $2^{\wedge}(N-1) C, ^{\wedge}2 (N-2) C, \ldots$ are coupled to the ground reference VSS in accordance with a B_code_pre signal (e.g., are so coupled in response to a binary pre-code signal received during the sampling phase), the remaining capacitors to Vref. A transfer function of monitoring circuit 400 for this configuration results in the monitored voltage Vin as being a non-linear function of the B_code signal in accordance with the equation:

$$Vin = \frac{Vref*(2^N - 1 - B\_code\_pre)}{Bcode}$$

Thereafter, in response to a binary code (Bcode) received during a conversion phase that follows the sampling phase of the monitoring circuit 400, switch device S20 disconnects the node 415 from the reference voltage Vref to float node 415, and switch devices S15-S19 couple the plate of selected capacitors 2N-1C, 2N-2C, . . . , 4C, 2C, C (Bcode*C) coupled to switch devices S15-S19 to the monitored voltage Vin, with the switch devices S15-S19 coupling the remaining capacitors 2N-1C, 2N-2C, . . . , 4C, 2C, C to the ground reference VSS. Accordingly, the binary pre-code signal can be generated in accordance with the equation: Vin=(Vref* (2^(N)−1−B_code_pre))/Bcode, where Vin is the monitored voltage, Vref is the reference voltage, B_code_pre is the binary pre-code, and Bcode is the binary code.

This allows a measurement of Vin that is not limited to voltages greater or equal to Vref. With exception of the digital control (not shown) this does not require extra hardware to implement.

Figure 5:
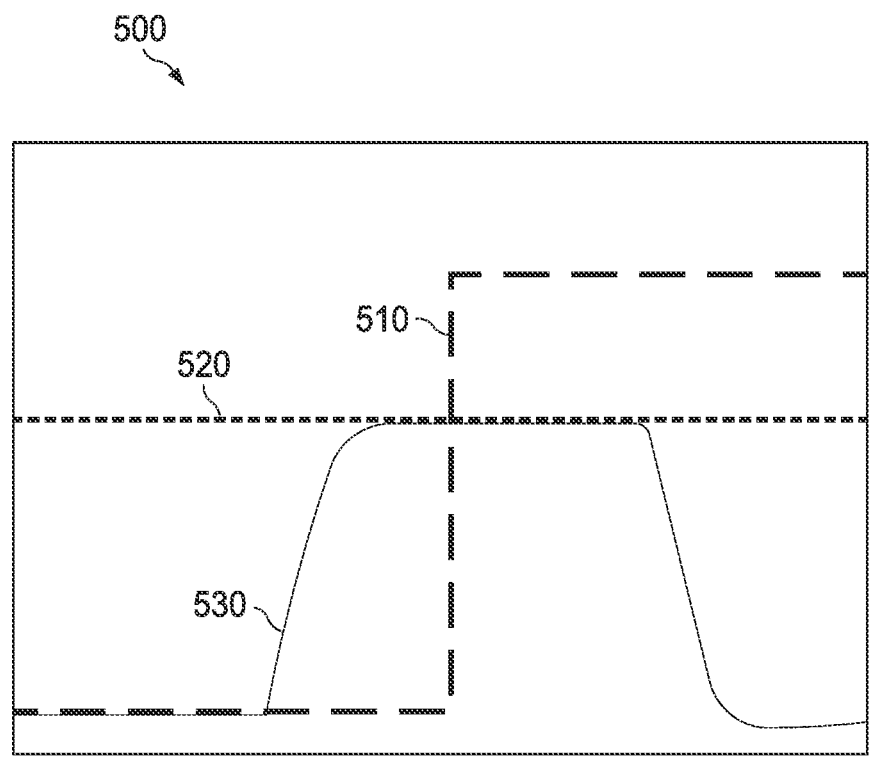
FIG. 5 illustrates an example waveform timing diagram for the monitoring circuit illustrated in FIG. 2.

FIG. 5 illustrates an example waveform timing diagram 500 for the monitoring circuit 200 illustrated in FIG. 2. In particular, the waveform timing diagram 500 includes a waveform of the clock signal CLK 510, the analog signal Vdiv 530, and the reference voltage Vref 520. As illustrated, the reference voltage Vref 520 is maintained at an approximately constant voltage. The analog signal Vdiv 530 rises from a logic low signal, prior to transition of the clock signal CLK 510 from a logic low to a logic high signal, to a level of the reference voltage Vref 520. Thereafter, the analog signal Vdiv 530 transitions, subsequent to transition of the clock signal CLK 510 from a logic high signal, back to a logic low signal.

Figure 6:
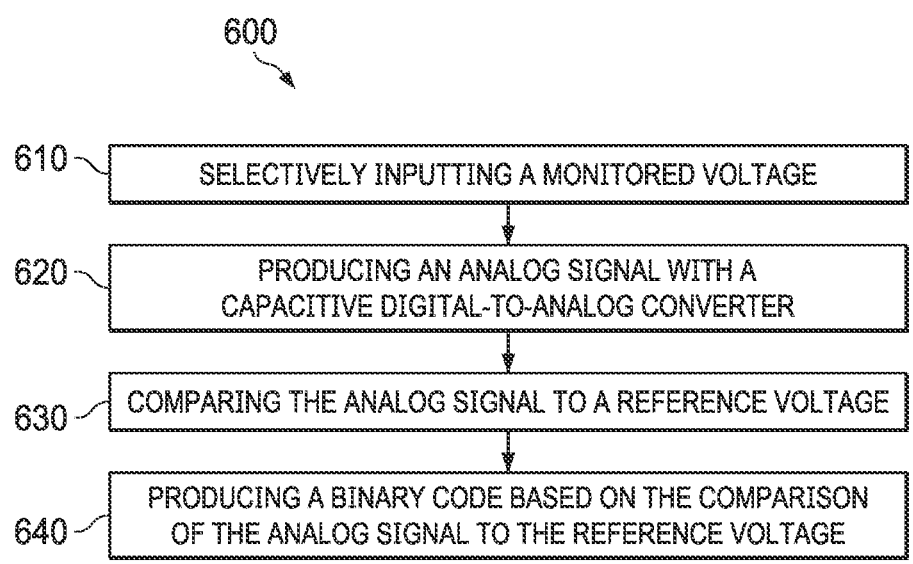
FIG. 6 illustrates an example method of monitoring a voltage.

In view of the foregoing structural and functional features described above, a method in accordance with various aspects of the present disclosure will be better appreciated with reference to FIG. 6. While, for purposes of simplicity of explanation, the method of FIG. 6 is shown and described as executing serially, it is to be understood and appreciated that the present disclosure is not limited by the illustrated order, as some aspects may, in accordance with the present disclosure, occur in different orders and/or concurrently with other aspects from that shown and described herein. Moreover, not all illustrated features may be required to implement a method in accordance with an aspect of the present disclosure. The example method of FIG. 6 may be implemented by hardware, such as in an IC chip or a combination of analog and/or discrete circuit components. In the example of FIG. 6, for purposes of explanation, the method 600 is described in the context of the example system of FIG. 1. In other examples, the method 600 may be implemented with respect to circuits and devices configured differently.

FIG. 6 illustrates an example method 600 of monitoring a voltage. While for ease of explanation, the method 600 is described in reference to the C-DAC 110 in the monitoring circuit 100 of FIG. 1, the method is equally applicable to each of the other example monitoring circuits disclosed herein with respect to FIGS. 2-4. At 610, the method 600 includes selectively receiving the monitored voltage Vin at an input of the C-DAC 110. A switch device, e.g., switch device S1, switches in accordance with the CLK monoshot pulse to selectively couple the monitored voltage Vin to the C-DAC 110.

At 620, the method 600 includes producing an analog signal Vdiv with the C-DAC 110 based on the B code. The C-DAC 110 receives a B code, a reference voltage Vref, a monitored voltage Vin, and a ground reference VSS, with the C-DAC 110 outputting the analog signal Vdiv based on the binary code. The C-DAC 110 receives the B code from the binary code generator 130.

At 630, the method 600 includes comparing the analog signal Vdiv to a reference voltage in accordance with a clock signal. The comparator 120 includes a first input coupled to receive the analog signal Vdiv and a second input coupled to the reference voltage Vref. The comparator 120 compares the analog signal Vdiv to the reference voltage Vref and outputs a comparator signal based on the comparison.

At 640, the method 600 includes producing the binary code based on the comparison of the analog signal to the reference voltage Vref, with the B code approximating a magnitude of the monitored voltage Vin. The binary code generator 130 generates the B code based on the comparator signal, with the B code approximating a magnitude of the monitored voltage Vin.

What have been described above are examples of the disclosure. It is, of course, not possible to describe every conceivable combination of components or method for purposes of describing the disclosure, but one of ordinary skill in the art will recognize that many further combinations and permutations of the disclosure are possible. As used herein, the term "based on" means based at least in part on. Accordingly, the disclosure is intended to embrace all such alterations, modifications, and variations that fall within the scope of this application, including the appended claims.

What is claimed is:

1. A monitoring circuit comprising:
 a digital-to-analog converter (DAC) comprising:
  a clock input configured to receive a first clock,
  a code input configured to receive a binary code,
  an analog input configured to receive an input voltage, and
  an output configured to provide an analog signal based on the binary code, and the input voltage;
 a comparator comprising:
  a first input coupled to the output of the DAC to receive the analog signal,
  a second input configured to receive a reference voltage,
  a clock input configured to receive a second clock having a faster frequency than the first clock, and
  an output configured to provide a comparator signal based on the analog signal and the reference voltage; and
 a binary code generator having an input coupled to the output of the comparator and an output configured to generate the binary code based on the comparator signal.

2. The monitoring circuit of claim 1, wherein the binary code generator comprises:
 a clock input configured to receive the second clock; and
 an up-down counter configured to increment by 1 or decrement by 1 the binary code based on the comparator signal and the second clock.

3. The monitoring circuit of claim 1, wherein the binary code generator comprises a successive approximation register configured to adjust the binary code based on the comparator signal.

4. The monitoring circuit of claim 1, further comprising:
 a plurality of capacitors, each having first and second plates; and
 a plurality of switches configured to, during a conversion phase, selectively couple each of the first plates to a ground reference terminal or the analog input of the DAC in accordance with the binary code.

5. The monitoring circuit of claim 1, wherein the input voltage is a battery voltage.

6. The monitoring circuit of claim 5, wherein the monitoring circuit is configured to monitor the battery voltage while consuming less than 1 pA of current.

7. The monitoring circuit of claim 1, wherein the analog input of the DAC is coupled to a battery.

8. The monitoring circuit of claim 1, wherein the DAC is a capacitive DAC.

9. The monitoring circuit of claim 1, wherein the DAC is further configured to receive a ground reference and the reference voltage.

10. The monitoring circuit of claim 1, wherein the analog input of the DAC is configured to receive the input voltage via a first capacitor.

11. The monitoring circuit of claim 10, wherein a ratio between frequencies of the first and second clocks is based on a leakage of the first capacitor.

12. The monitoring circuit of claim 1, wherein the input voltage is greater than the reference voltage.

13. The monitoring circuit of claim 1, wherein the input voltage is less than the reference voltage.

14. The monitoring circuit of claim 1, wherein the first clock has 1 clock pulse for every 100 conversions by the DAC.

15. The monitoring circuit of claim 1, wherein the DAC comprises a first switched having a first terminal coupled to the output of the DAC, and a control terminal configured to receive the first clock.

16. A monitoring method comprising:
 receiving an input voltage at an analog input of a digital-to-analog converter (DAC);

receiving a first clock at a clock input of the DAC;
receiving a binary code at a code input of the DAC;
producing, by the DAC, an analog signal based on the binary code and the input voltage;
comparing the analog signal to a reference voltage in accordance with a second clock to generate a comparison signal, wherein the second clock has a faster frequency than the first clock; and
producing the binary code based on the comparison signal.

17. The method of claim 16, further comprising selectively coupling each of a plurality of capacitors of the DAC to a ground reference terminal in accordance with the binary code.

18. The monitoring method of claim 16, further comprising selectively coupling a capacitor of the DAC to a ground reference terminal, in accordance with the first clock.

19. A device comprising:
a digital-to-analog converter (DAC) comprising:
an analog input configured to receive an input voltage,
a code input configured to receive a binary code,
a reference input configured to receive a reference voltage,
a ground input,
a clock input configured to receive a first clock,
an output configured to provide an analog signal based on the input voltage and the binary code,
a first capacitor coupled to the output of the DAC, and
a switch coupled between the output of the DAC and the ground input, the switch comprising a control terminal configured to receive the first clock;
a comparator configured to compare the analog signal with the reference voltage to a comparator signal in accordance with a second clock that has a frequency faster than a frequency of the first clock; and
a binary code generator configured to generate the binary code based on the comparator signal.

20. The device of claim 19, wherein a plurality of switch devices is configured to selectively couple each of a plurality of capacitors of the DAC to the reference input in accordance with the binary code.

21. The device of claim 19, wherein the binary code generator comprises an up-down counter configured to increment or decrement the binary code based on the comparator signal.

* * * * *